United States Patent [19]

Buiguez et al.

[11] Patent Number: 4,770,977
[45] Date of Patent: Sep. 13, 1988

[54] SILICON-CONTAINING POLYMER AND ITS USE AS A MASKING RESIN IN A LITHOGRAPHY PROCESS

[75] Inventors: François Buiguez, Saint Egreve; Louis Giral, Montpellier; Charles Rosilio, les Ulis; François Schue, Strasbourg, all of France

[73] Assignee: Commissariat a l'Energie Atomique, Paris, France

[21] Appl. No.: 46,913

[22] Filed: May 7, 1987

Related U.S. Application Data

[62] Division of Ser. No. 777,611, Sep. 29, 1985, Pat. No. 4,689,288.

[51] Int. Cl.[4] .............................................. G03C 5/16
[52] U.S. Cl. .................................... 430/323; 430/326; 430/313; 430/270; 156/643
[58] Field of Search .............. 430/326, 313, 323, 270; 156/643

[56] References Cited

U.S. PATENT DOCUMENTS 4,442,197  4/1984  Crivello et al. ............... 430/270 X
4,551,417  11/1985  Suzuki et al. .................. 430/270 X

FOREIGN PATENT DOCUMENTS 0102450  3/1984  European Pat. Off. ............ 430/287

Primary Examiner—Paul R. Michl
Assistant Examiner—Cynthia Hamilton
Attorney, Agent, or Firm—Nutter, McClennen & Fish

[57] ABSTRACT

Photosensitive film which is photosensitive in a given wavelength range comprises at least one silicon-containing polymer, at least one salt which can be converted into a Brunsted acid by irradiation and optionally at least one photosensitizer. The silicon-containing polymer-based photosensitive film can be used as a masking resin in a lithography process for producing electronic components.

7 Claims, 3 Drawing Sheets

SILICON-CONTAINING POLYMER AND ITS USE AS A MASKING RESIN IN A LITHOGRAPHY PROCESS

RELATED APPLICATION

This application is a division of application Ser. No. 777,611, filed Sept. 29, 1985, now U.S. Pat. No. 4,689,288.

BACKGROUND OF THE INVENTION

The present invention relates to a photosensitive film usable more particularly in microlithography for producing electronic components, such as integrated circuits. Microlithography is a widely used technique in the field of the production of electronic components, where it is used for producing on a substrate designs having lines of approximately 1 micron or submicron lines.

In such microlithography techniques, on the substrate is generally deposited a photosensitive film. On said film is then formed by irradiation, designs which are then revealed by using a solvent for dissolving either the film zones which have been exposed to irradiation, or the film zones which have not been exposed to irradiation. In this way, openings are formed in the film covering the substrate and it is then possible to carry out treatments, such as etching or ion implantation on the thus revealed substrate zones.

During irratiation, there is a chemical reaction in the film, which can either lead to increased solubility of the film due to depolymerization, or to a chemical modification of the film. Conversely it can lead to an insolubility of the film in certain solvents resulting from a cross-linking or chemical modification. In addition, by choosing an appropriate treatment or solvent, it is possible to eliminate the film either at the locations where it has been irradiated, or at the locations where it has not been irradiated.

In the first case where the irradiation zones are eliminated, the photosensitive film is of the positive type, whereas in the second case where the non-irradiated zones are eliminated, the photosensitive film is of the negative type. In all cases, the photosensitive film must fulfil a double function. Firstly, it must permit a good degree of resolution, i.e. a good definition of the designs constituted e.g. by micron or submicron lines. Secondly, the non-eliminated zones of the film must be able to resist the following treatments performed for producing integrated circuits and must in particular resist dry etching by gaseous plasma. Generally, it is difficult to perfectly fulfil these two functions by means of the same photosensitive film layer. Thus, a good resolution of the design necessitates a very fine layer, generally having a thickness less than 0.5 μm, whereas a good resistance to dry etching requires the presence of a thicker layer, generally having a thickness exceeding 1 μm. Hitherto, to meet these two requirements, use has been made of multilayer systems. Such systems are more particularly described in the article by B. J. Lin, "Multilayer Resist Systems", appearing in the work published by L. F. Thompson, C. G. Willson and M. J. Bowden entitled "Introduction to Microlithography", ACS Symposium Series (Washington, D.C.), 1983, pp. 287 to 350.

FIGS. 1 to 4 show a multilayer system of this type and illustrate its use for masking certain zones of a substrate.

In FIG. 1, it is possible to see that the substrate 1, e.g. formed by a silicon substrate, is covered by a multilayer system 3 formed by three layers 3a, 3b and 3c. The first layer 3a, directly deposited on substrate 1 is a thick resin layer, e.g. having a thickness of approximately 2 μm and it is called the levelling layer, because its function is to level out topographic variations on the substrate. The second layer 3b is an intermediate layer formed from a material resisting reactive gaseous plasmas and e.g. $SiO_2$, Si, $Si_3N_4$ or Al. The third layer 3c is a thin photosensitive resin layer with a thickness of 0.2 to 0.5 μm, which is used for the inscription of the patterns by irradiation with a good resolution.

In order to inscribe patterns on a substrate using a system of this type, the substrate coated at the desired locations, like that shown in FIG. 1 is irradiated, as shown by the arrows, followed by the elimination of the zones of layer 3c which have been irradiated by dissolving in an appropriate solvent. This leads to a substrate 1 covered with layers 3a, 3b and a layer 3c, on which are inscribed the desired patterns, in the manner shown in FIG. 2.

At the end of this operation, layer 3b is etched by transferring thereto the patterns inscribed by etching in layer 3c, e.g. using trifluoromethane in the case where layer 3b is made from $SiO_2$, which makes it possible to eliminate layer 3b at the points where it is not protected by the resin layer 3c. This leads to the structure shown in FIG. 3.

This is followed by the transfer of the etched patterns from layer 3b in the thick resin layer 3a by the action of a reactive gaseous plasma, such as an oxygen plasma, which makes it possible to obtain the structure shown in FIG. 4 and simultaneously eliminate the upper photosensitive resin layer 3c, which does not resist the action of the reactive gaseous plasma.

This procedure gives satisfactory results with regards to the resolution of the patterns, but suffers from the disadvantage of being difficult and costly to perform. Thus, the resin layers 3a and 3c can be deposited by centrifuging, but the intermediate layer 3b of $SiO_2$, Si, $Si_3N_4$ or Al is deposited by sputtering or chemical vapour phase deposition, which requires complicated costly equipment and more complex operations.

SUMMARY OF THE INVENTION

The present invention specifically relates to a photosensitive film obviating the disadvantages of the aforementioned multilayer systems, while making it possible to obtain a good resolution of the patterns in microlithography.

The photosensitive film according to the invention in a given wavelength range comprises:

(a) at least one silicon-containing polymer in accordance with the formula:

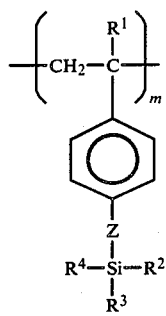

in which $R^1$ represents H or an alkyl radical of one to four carbon atoms, $R^2$, $R^3$ and $R^4$, which can be the same or different, represent an alkyl radical of one to four carbon atoms and Z represents —O—, —(CH$_2$)$_n$—O— with n being an integer between 1 and 4, or

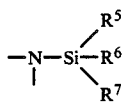

with $R^5$, $R^6$ and $R^7$, which can be the same or different, representing an alky radical of one to four carbon atoms and m a number between 25 and 2000, (b) at least one salt which can be converted into a Brunsted acid by irradiation at a wavelength in the given wavelength range, and optionally (c) at least one photosensitizer.

For 100 parts by weight of said silicon-containing polymer or polymer, it advantageously has 2 to 25 parts and preferably 5 to 15 parts by weight of said salt or salts and 0 to 10 parts by weight of said photosensitizer or photosensitizers.

The use within the photosensitive film according to the invention of a silicon-containing polymer in accordance with formula(I) and a salt which can be converted by photolysis into a Brunsted acid makes it possible to obtain by irradiation at a wavelength corresponding to the photosensitivity range of the salt or photosensitizer, a conversion of the silicon-containing polymer of formula I into a non-silicon-containing polymer by cleaving at the level of bond O-Si or N-Si. In the case of the polymer of formula (I) with Z representing —O—, said reaction corresponds to the following reaction diagram:

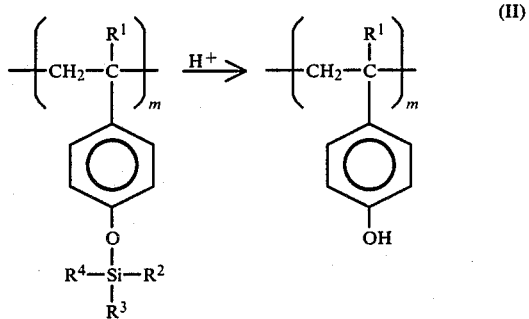

In the case where Z represents —(CH$_2$)$_n$—O—, the reaction is of the same type and leads to a polystyrene alcohol. In the case where Z represents

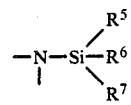

a polaminostyrene is obtained.

The polyvinylphenol of formula (II), the polystyrene alcohol and polyaminostyrene produced in this way have properties which differ widely from those of the silicon-containing polymer of formula (I), particularly as regards their solubility in different solvents and their resistance to reactive gaseous plasmas. Thus, in the case where Z represents —O—, the silicon-containing polymer of formula (I) is insoluble in alcoholic solvents and alkaline solvents and resistant to reactive gaseous plasmas, whereas the polyvinylphenol of formula (II) is soluble in alkaline and alcoholic solvents and has a low resistance to reactive gaseous plasmas. Therefore, use can be made of this difference in properties between the two polymers, in microlithography, for simplifying the three-layer systems according to the prior art, by replacing the intermediate layer and the thin photosensitive layer thereof by the photosensitive film according to the invention, thus obviating costly, complex operations connected with the deposition of the intermediate layer.

Bearing in mind the properties referred to hereinbefore, said photosensitive film can be used as a positive film, whereby the irradiated zones can be selectively eliminated by dissolving in an alkaline or alcoholic medium, whilst leaving the non-irradiated zones intact.

However, it is also possible to envisage the use of the photosensitive film according to the invention as a negative film, because the polyvinyl phenol of formula (II) obtained by irradiation is insoluble in non-polar solvents, which makes it possible to dissolve the polymer of formula (I) which has not been subject to irradiation by means of an appropriate non-polar solvent.

The silicon-containing polymers according to formula (I) can be obtained by radical polymerization of monomers in accordance with formula (III);

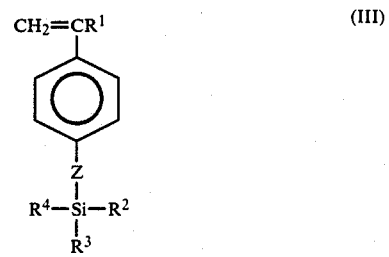

in which $R^1$, $R^2$, $R^3$, $R^4$ and Z have the same meanings as hereinbefore.

This polymerization can be initiated by means of an initiator, such as azo-bis-isobutyronitrile. In the case where Z represents —O— or —(CH$_2$)$_n$—O—, the starting monomer can be obtained by reacting a compound of formula:

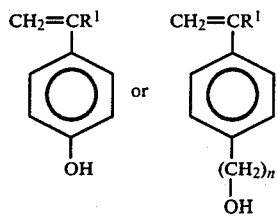 or with an excess of a compound of formula:

$$\left( \begin{matrix} R^2 \\ R^3-Si \\ R^4 \end{matrix} \right)_2 NH$$

In the case where Z represents $$-N-Si\begin{matrix} R^5 \\ R^6 \\ R^7 \end{matrix}$$

the starting monomer can be obtained by the reaction of

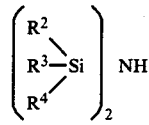

with an excess of the compound of formula $$\left( \begin{matrix} R^2 \\ R^3-Si \\ R^4 \end{matrix} \right)_2 NH$$

Examples of starting monomers which can be used are:

p-trimethylsilyoxystyrene

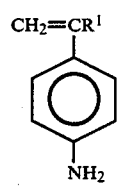

p-trimethylsilyloxy (α-methylstyrene)

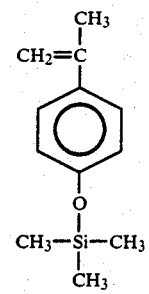

p-trimethylsilylethoxystyrene

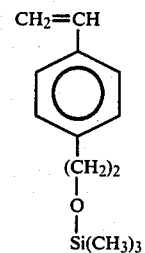

para-N,N-bis(trimethyl silyl)aminostyrene

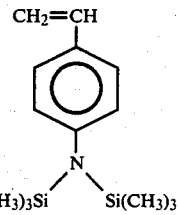

In the photosensitive film according to the invention, advantageously use is made of silicon-containing polymers of formula (I), in which $R^1$ represents hydrogen or a methyl radical, namely polymers derived from styrene or α-methylstyrene.

In the silicon-containing polymers according to the invention, the alkyl radicals $R^2$, $R^3$ and $R^4$, as well as the alkyl radicals $R^5$, $R^6$ and $R^7$ are generally identical alkyl radicals and preferably methyl radicals.

In order to be able to convert the silicon-containing polymer into a non-silicon-containing polymer by reaction with an acid, the photosensitive film according to the invention necessarily incorporates a salt which can be converted into a Brunsted acid by irradiation at a wavelength in a given range, which permits the in situ formation in the film by irradiation, the acid necessary for the conversion of the silicon-containing polymer. These salts are known as Crivello salts and are in particular described in the publication: J. V. Cirvello, Advances in Polymer Science, vol. 62, 1984, pp. 1–48.

Examples of such salts are triaryl sulphonium salts, dialkyl phenacyl sulphonium salts, dialkylhydroxy phenyl sulphonium salts, diaryl iodonium salts, triaryl selenonium salts and trilluraonium salts.

The sulphonium salts can be in accordance with the formula

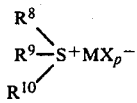

in which $R^8$, $R^9$ and $R^{10}$, which can be the same or different, represent aryl or alkyl radicals which can optionally be substituted, M is an element of the periodic classification of elements which can form an anion with a halogen, X is a halogen atom and p is equal to $v+1$, with v representing the valency state of M.

In this formula, $R^8$, $R^9$ and $R^{10}$ can represent an alkyl radical, a phenyl radical, a phenyl radical substituted by at least one substituent chosen from among the alkyl, alkoxy or alkylamido radicals, halogen atoms, the hydroxyl radical and the nitro radical.

Two of the radicals $R^8$, $R^9$ and $R^{10}$ can also form together with the sulphur atom to which they are bonded, a heterocycle such that:

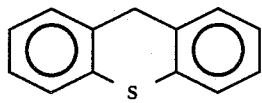

As an example of the cation

reference can be made to the following cations:

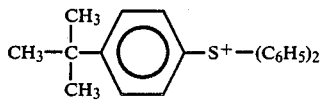

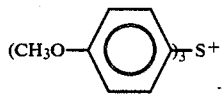

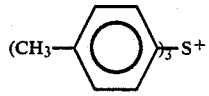

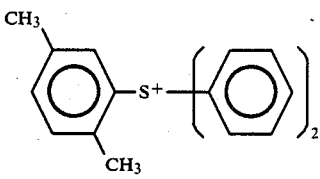

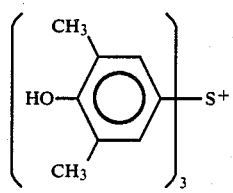

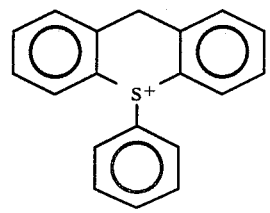

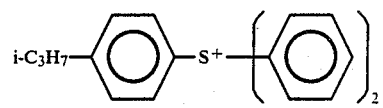

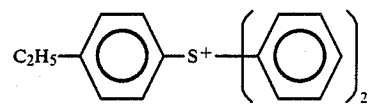

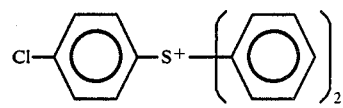

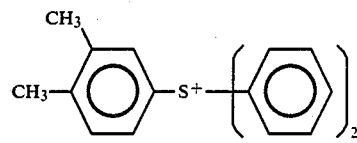

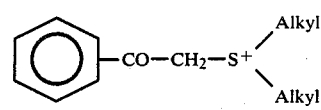

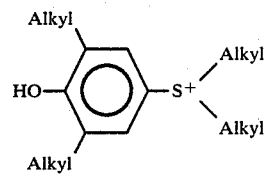

For example, the anion $MX_p^-$ can be chosen from among $BF_4^-$, $AsF_6^-$, $PF_6^-$ and $SbF_6^-$.

The diaryliodonium salts can be in accordance with the formula

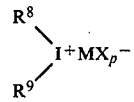

in which $R^8$ and $R^9$, which can be the same or different, represent an optionally substituted aryl radical, M represents an element of the periodic classification of elements able to form an anion with a halogen, X represents a halogen atom and p is equal to $1+v$ with v representing the valency state of M.

The aryl radicals which can be used are of the same type referred to hereinbefore for the triaryl sulphonium salts. For example, the cation $Ar_2I^+$ can be in accordance with the following formulas:

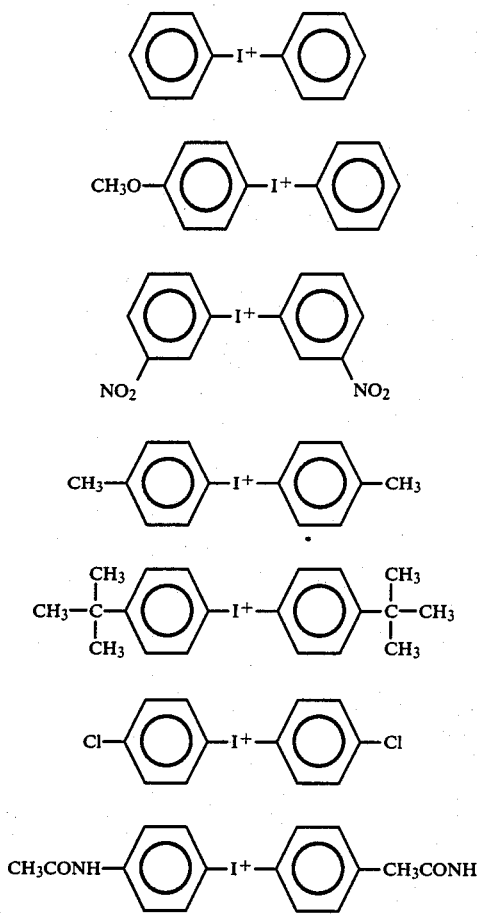

In diaryliodonium salts, the anion $MX_p^-$ can be one of the aforementioned anions.

Crivello salts have the property of being photosensitive in certain wavelength ranges dependent on the nature of the salt and of being convertible by irradiation in said wavelength range into a Brunsted acid.

In the case of triaryl sulphonium salts, the photosensitivity range of the salts is in the wavelength range 220 to 320 nm. In the case of diaryliodonium salts, the photosensitivity range of the salts is in the wavelength range 210 to 280 nm.

However, according to the invention, it is possible to modify the photosensitivity range of the Crivello salts referred to hereinbefore by adding to the composition a photosensitizer which can be present at a rate of 3 to 10 parts by weight per 100 parts by weight of the silicon-containing polymer.

The photosensitizer can be an aromatic hydrocarbon, such as perylene, pyrene, anthracene, tetracene, phenothiazine and acetophenone and it is chosen as a function of the Crivello salt used. Thus, in the case of triaryl sulphonium salts, it is possible to use perylene, which modifies the photosensitivity range of these salts by bringing it into the wavelength range between 386 and 475 nm, the maximum photosensitivity being observed at 436 nm and an adequate photosensitivity at 405 nm.

Within, the scope of the present invention, the term photosensitivity range of the film means the wavelength range in which the salt is photosensitive when the film contains no photosensitizer or the wavelength range in which the photosensitizer is sensitive when the film contains such a photosensitizer.

As a result of their photosensitivity and their resistance to certain reagents, particularly reactive gaseous plasmas, the photosensitive films according to the invention can be used as positive films in microlithography by being associated with a thick resin layer serving to level out topographical variations of the substrate. It is thus possible to replace the three-layer systems according to the prior art by a two-layer system according to the invention, which in particular makes it possible to avoid the stage of depositing the intermediate layer by chemical phase vapour deposition. While also preventing the plasma etching stage of the intermediate layer.

The present layer also relates to a process for masking certain zones of a substrate, which comprises the following successive stages:

(a) depositing on said substrate a first resin layer with a thickness such that it constitutes a substrate levelling layer, (b) depositing on said first resin layer a second layer of the photosensitive film according to the invention, (c) irradiating the zones of the second layer corresponding to the substrate zones which are not to be masked, by means of radiation having a wavelength corresponding to the photosensitivity range of the photosensitive film, and (d) eliminating the second photosensitive film layer and the first resin layer at the points corresponding to the zones of the second layer which have been irradiated.

According to a first embodiment of the process according to the invention, in stage (d) firstly the second photosensitive film layer is eliminated by dissolving in a solvent and then the first resin layer is eliminated by reactive ionic etching in a gaseous plasma.

As has been seen hereinbefore, the irradiation of the second photosensitive film layer converts the silicon-containing polymer of formula (I) into a non-silicon-containing polymer, e.g. into a polyphenol of formula (II), which has the property of being soluble in alkaline and alcoholic solvents, whereas the silicon-containing polymer of formula (I) is insoluble in the same solvents. It is also possible to eliminate the second photosensitive film layer at the points which have been exposed to radiation by dissolving in an alkaline solvent such as soda, potash and quaternary ammonium salts, or in an alcoholic solvent such as methanol.

It is then possible to eliminate the first layer, e.g. by reactive ionic etching in a gaseous plasma, because the silicon-containing polymer of formula (I) has a high resistance to the action of reactive gaseous plasmas, such as an oxygen plasma.

According to a second embodiment of the process according to the invention, in stage (d), there is a simultaneous elimination of the second photosensitive film layer and the first resin layer by reactive ionic etching in a gaseous plasma, such as an oxygen plasma. Thus, the non-silicon-containing polymer obtained during the irradiation has a limited resistance to the action of reactive gaseous plasmas, such as an oxygen plasma and it is therefore possible to simultaneously eliminate the first and second layers deposited on the substrate at the points corresponding to the zones of the second layer which have been irradiated. In this second embodiment of the process according to the invention, it is advantageous to use in stage (c) a substantially higher irradiation dose than in the case of the first embodiment of the process, in order to obtain a complete development.

For performing the process according to the invention, the first resin layer has to be deposited by conventional processes, e.g. by centrifuging. The deposited thickness is generally approximately 2 μm, as in the prior art processes. For forming said first layer, it is possible to use resins of the same type as in the prior art, e.g. phenol formaldehyde resins, such as novolaks, which do not resist the action of a reactive gaseous plasma. Generally, following the deposition of the first resin layer on the substrate, the latter undergoes annealing in order to harden the resin and make it inactive. This hardening is generally accompanied by a modification of the ultraviolet absorption spectrum of the resin and makes it more absorbent in the vicinity of 400 nm, which makes it possible to avoid during the irradiation of the substrate coated with two layers, reflections of the incident light on the substrate, which would be prejudicial to obtaining a good resolution of the design.

The second photosensitive film layer can also be deposited by centrifuging. Generally, the composition containing at least one silicon-containing polymer, at least one Crivello salt and optionally at least on photosensitizer is dissolved in an appropriate solvent, such as dichloromethane. The deposited film thickness does not generally exceed 0.4 μm and is advantageously 0.2 to 0.4 μm in order to obtain a good resolution. Following the deposition of the second layer, the latter undergoes drying to eliminate the solvent.

According to a3 preferred embodiment of the process according to the invention, the photosensitive film contains per 100 parts by weight of poly-p-trimethylsilyloxystyrene, 5 to 15 parts by weight of triphenyl sulphonium hexafluoroarsenate and 3 to 10 parts by weight of perylene. Under these conditions, it is possible to carry out irradiation at a wavelength of 386 to 475 nm and preferably 436 nm.

The invention also relates to silicon-containing polymers usable for forming a photosensitive film and which are in accordance with the formula:

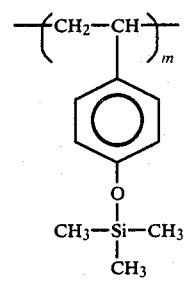

in which $R^1$ represents H or an alkyl radical of one to four carbon atoms, $R^2$, $R^3$ and $R^4$, which can be the same or different, represent an alkyl radical of one to four carbon atoms, Z represents —O—, —(CH$_2$)$_n$—O— with n being an integer between 1 and 4, or

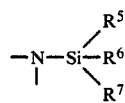

with $R^5$, $R^6$ and $R^7$, which can be the same or different, representing an alkyl radical of one to four carbon atoms and m is a number between 25 and 2000, provided that $R^2$, $R^3$ and $R^4$ do not represent CH$_3$ when $R_1$ represents H and Z represents —O—, —O—CH$_2$—CH$_2$— or —N—Si(CH$_3$)$_3$.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
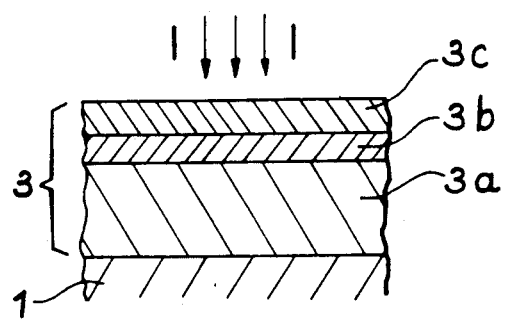
FIGS. 1 to 4 already described, a multilayer film according to the prior art.
Figure 2:
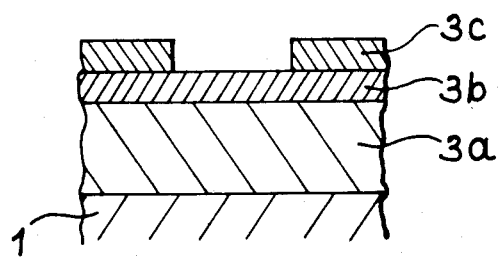
Figure 3:
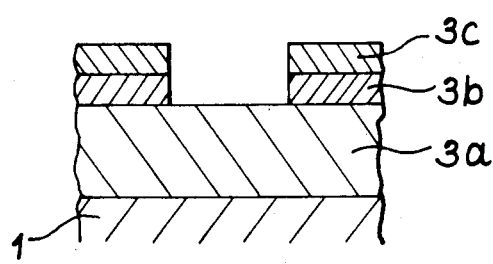
Figure 4:
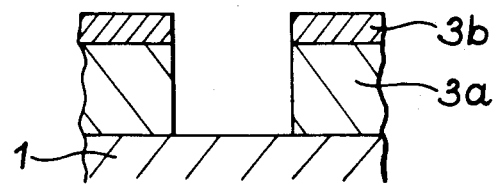

In this example, the photosensitive film according to the invention is constituted by a film containing a silicon-containing polymer of formula:

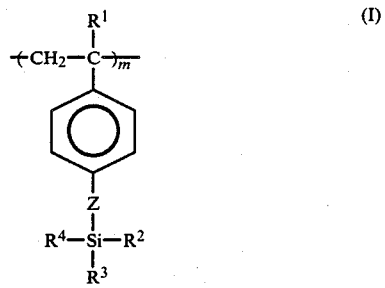

This polymer was obtained by radical polymerization of p-trimethylsilyloxystyrene in solution in toluene, using as the polymerization initiator azo-bis-isobutyronitrile and performing polymerization at a temperature of 69° C. for 24 hours, which leads to a 73% yield. The polymer obtained was gas chromatographically characterized and the following results were obtained:

number-average molecular weight $\overline{M}_n = 51,000$
weight-average molecular weight $\overline{M}_p$ (or $\overline{M}_v$) = 117,600
dispersion index $\overline{M}_p/\overline{M}_n$: 2.31, and
glass transition temperature $T_v$: 75°–76° C.
determined by differential thermal analysis.

The polymer obtained is soluble in tetrahydrofuran, benzene, methylene chloride, chloroform, petroleum ether, ethyl ether, acetone, toluene and carbontetrachloride. However, it is insoluble in methanol, water and alkaline solutions.

The starting monomer was obtained from 4-vinylphenol by treatment with an excess of hexamethyldisilazane of formula [(CH$_3$)$_3$Si]$_2$NH at a temperature of 30° C. for 10 hours. The pure monomer was isolated by fractional distillation. The reaction corresponds to a 90% yield and the boiling point of the monomer is 65° C. under 4 millibars (400 Pa).

In the photosensitive film of this example, the Crivello salt used is triphenyl sulphonium hexafluoroarsenate (melting point: 195° to 198° C.).

To make the silicon-containing polymer—Crivello salt composition photosensitive at the wavelength of 436 nm, perylene is added thereto and acts as the photosensitizer.

It is then possible to use this composition for masking certain zones of a substrate constituted in the present example by a silicon plate. On to the latter is firstly deposited by centrifuging a first layer of a novolak marketed under the trademark HPR 206 by Hunt Chemical Cy, using a speed of 4000 t/m in order to obtain a first resin layer with a thickness of approximately 2 μm acting as a levelling layer for the silicon substrate. The thus deposited resin layer then undergoes annealing at 220° C., either in an oven for one hour, or on a hot plate for 2 minutes. This annealing leads to a hardening of the resin and makes it inactive. Moreover, the hardening leads to a modification of the ultraviolet absorption spectrum of the resin and the absorption becomes high at the wavelength of 436 nm, which makes it possible to obviate reflections of the incident light on the substrate, which would be prejudicial for obtaining a high resolution. Conversely, absorption at 550 nm is slight, which makes it possible to use this wavelength for carrying out the position of the silicon plate on the irradiation device. Following these operations, on the thus coated silicon plate is deposited a layer of photosensitive film from a solution of the film in dichloromethane obtained by dissolving in 100 ml of dichloromethane 10 g of poly-p-trimethylsilyloxystyrene, 1 g of triphenyl sulphonium hexafluoroarsenate and 0.5 g of perylene and by then filtering the solution over a Millipore filter having a pore size of 0.5 μm.

Deposition by centrifuging takes place in such a way as to cover the novolak resin-coated silicon plate with a second layer having a thickness of 0.4 μm. The second photosensitive film layer is then dried to eliminate the solvent at a temperature of 65° C., either for 15 minutes in an oven, or for 2 minutes on a hot plate.

Figure 5:
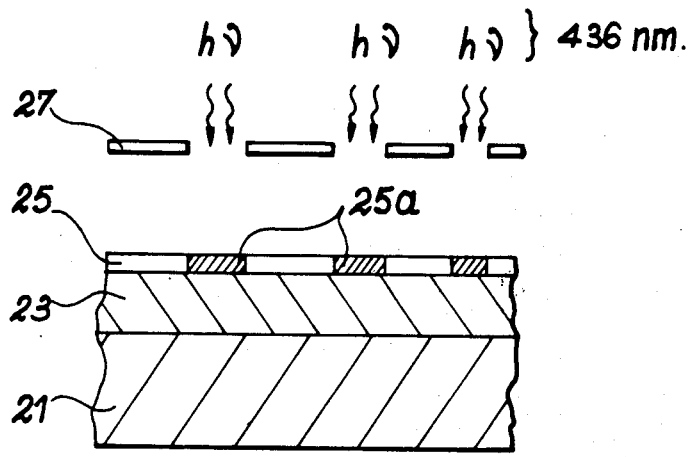
FIGS. 5, 6, and 7 the use of the photosensitive film according to the invention in microlithography.

In this way the coated plate according to FIG. 5 is obtained. In FIG. 5 it is possible to see that the substrate 21 constituted by the silicon plate is covered with a first resin layer 23 having a relatively large thickness (2 μm) and also a second layer 25 of the photosensitive film according to the invention.

In order to form a mask on certain zones of the substrate 21, the assembly undergoes irradiation by radiation (hv) with a wavelength of 436 nm, as shown by the arrows, using a masking device 27 placed between the radiation source and the coated silicon plate, so that only zones 25a of the photosensitive film layer 25 are irradiated.

For carrying out this irradiation, use is made of a photo repeater and a total irradiation dose of 80 mJ/cm$^2$. Following irradiation, the silicon-containing polymer of zones 25a of the layer of photosensitive film 25 is converted by reaction with the Brunsted acid produced by photolysis of the triphenyl sulphonium hexafluoroarsenate, in the presence of perylene, in a polyvinyl phenol of formula (II). This modification of zones 25a is revealed by infrared spectrometry of the substrate coated with the photosensitive film layer before and after irradiation.

Figure 8:
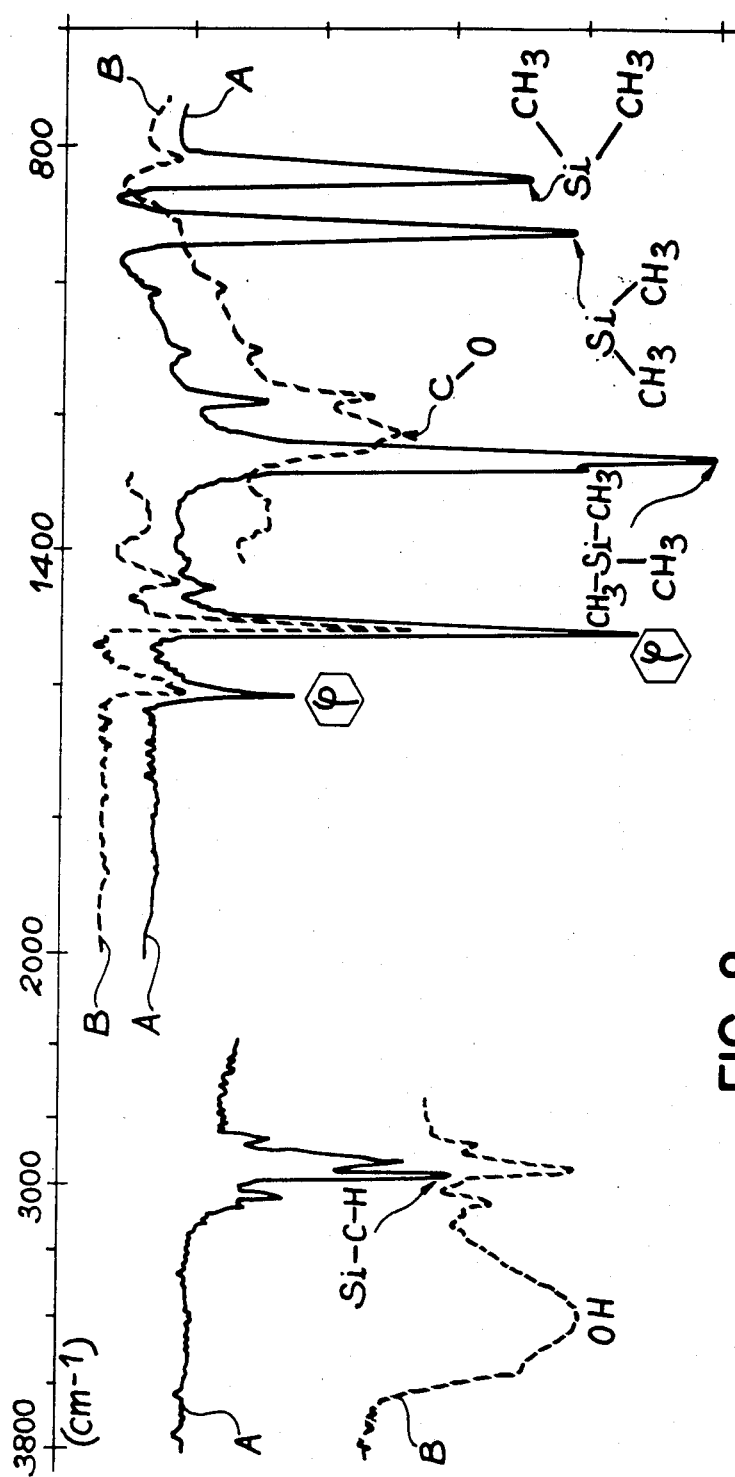
FIG. 8 the infrared absorption spectrum of a substrate coated with the photosensitive film according to the invention, before and after irradiation at 436 nm.

FIG. 8 illustrates the results obtained in infrared spectrometry. Thus, in FIG. 8, curves (A) relate to the infrared absorption spectrum obtained before the irradiation of the coated substrate and curves (B) relate to the infrared absorption spectrum obtained after irradiation. It can be seen that the silicon-containing polymer has been converted into polyvinylphenol.

Following irradiation, the coated plate undergoes an annealing treatment for 5 minutes at 65° C. in order to increase the chemical reaction of converting the polymer of formula (I) into a polymer of formula (II) in zones 25a, which have undergone irradiation. In this stage, the patterns already appear on the plate, zones 25a of the second layer 25 being slightly in intaglio compared with the remainder of the layer.

This is followed by the elimination of the second layer in zones 25a by dissolving with the aid of an alcoholic solution. To this end, the plate is introduced into a methanol bath at 20° C. and for 1 minute, followed by drying under a dry nitrogen jet. This leads to the structure shown in FIG. 6, i.e. the elimination of zones 25a from the second layer 25 and the formation of intaglio patterns in said layer.

The thus formed patterns are then transferred into the first thick layer 23 of resin HPR 206. This is done by reactive ionic etching in an oxygen plasma. To this end, the silicon plate is placed on the cathode of a reactive ionic etching reactor and etching takes place by oxygen plasma under the following conditions:
oxygen pressure: 10 millitorr(1.35 Pa),
oxygen flow rate: 10 cm$^3$/min,
generator frequency: 13.56 MHz
power: 0.5 W/cm$^2$.

The end of the etching of layer 23 is detected by laser interferometry.

This leads to an elimination of layer 23 on the zones not protected by layer 25. Thus, under oxygen plasma etching conditions, the etching speed of resin 23 is approximately 120 nm/min, whereas for the photosensitive film 25, the erosion is substantially zero, the etching speed being 5 nm/min.

Figure 7:
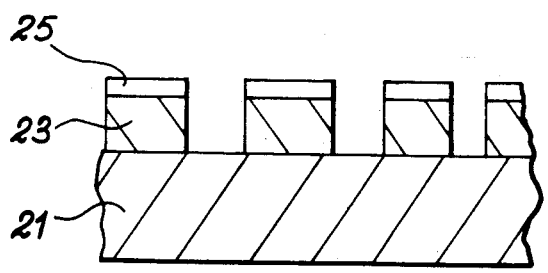

Thus, the second layer 25 acts as an in situ mask during the anisotropic etching of the first layer 23 and, at the end of the operation, the structure shown in FIG. 7 is obtained, i.e. the transfer of the patterns from layer 25 to layer 23.

By observation with the electron microscope of the structure obtained in FIG. 7, it can be seen that the etched patterns have a line width of 0.65 to 0.7 μm on thicknesses of approximately 2 μm. Thus, the submicron patterns obtained with a high resolution on the second layer 25 of the photosensitive film according to the invention have been transferred into the first resin layer 23, while retaining the line width during etching by the oxygen plasma.

Figure 6:
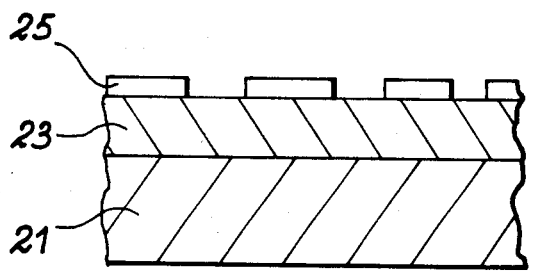

In a variant, the intermediate stage shown in FIG. 6 is avoided by directly eliminating by the dry route the zones 25a of the second layer 25 and the corresponding zones of the first layer 23.

In this ase, the silicon plate 21 is coated by the first layer 23 of resin HPR 206 and by the second photosensitive film layer 25 under the same conditions as hereinbefore. The coated plate then undergoes irradiation at 436 nm using the same masking device 27 and the same irradiation apparatus, but while continuing irradiation up to obtaining a dose of 100 to 120 mJ/cm$^2$. In this way and as hereinbefore, there is a modification of the second layer 25 on zones 25a and, after irradiation, the assembly is annealed at a temperature of 65° C. and for 5 minutes.

Following this operation, the irradiated plate is directly exposed to the action of the oxygen gaseous plasma by placing it on the cathode of the reactive ionic etching reactor and by carrying out etching under the same conditions as hereinbefore.

This leads to the elimination of zones 25a of the second layer 25 and the elimination of the corresponding zones of layer 23, which makes it possible to directly obtain the structure shown in FIG. 7. Under these conditions, the etching speed of the second layer 25 on zones 25a and the first layer 23 are respectively 75 nm/min and 70 nm/min, whereas the etching speed of layer 25 on the points where it has not been irradiated is only 3 nm/min. Thus, a high selectivity is obtained, which makes it possible to simultaneously bring about the elimination of layers 23 and 25 at the desired points by reactive ionic etching in the oxygen gaseous plasma.

This variant is of particular interest, because it makes it possible to simultaneously develop the second layer and etch the first layer by the dry route using a plasma, which is easier to carry out, faster and makes it possible to obviate the disadvantages of development by the wet route.

What is claimed is:

1. A process for masking certain zones of a substrate, wherein it comprises the following successive stages:
   (a) depositing on said substrate a first resin layer having a thickness such that it constitutes a levelling layer for the substrate,
   (b) depositing on said first resin layer, a second photosensitive film layer which comprises
      (1) at least one silicon-containing polymer in accordance with the formula:

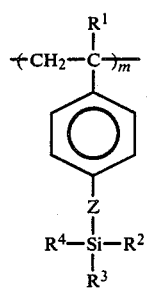

(I)

in which $R^1$ represents H or an alkyl radical of one to four carbon atoms, $R^2$, $R^3$, and $R^4$, being the same or different, represent an alkyl radical of one to four carbon atoms, Z represents —O—, $(CH_2)_n$—O— with n being an integer between 1 and 4, or

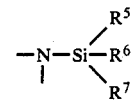

with $R^5$, $R^6$ and $R^7$, being the same or different, representing an alkyl radical of one to four carbon atoms, and m being a number between 25 and 2000, and
   (2) at least one salt which is converted into a Brunsted acid upon irradiation at a wavelength in the given wavelength range,
   (c) irradiating the zones of the second layer corresponding to the substrate zones which are not to be masked, by means of radiation with a wavelength corresponding to the photosensitivity range of the photosensitive film, and
   (d) eliminating the second photosensitive film layer and the first resin layer at the points corresponding to the zones of the second layer which have been irradiated.

2. A process according to claim 1, wherein in stage (d), firstly the second photosensitive film layer is eliminated by dissolving in a solvent and wherein the second resin layer is then eliminated by reactive ionic etching in a gaseous plasma.

3. A process according to claim 1, wherein in stage (d), there is a simultaneous elimination of the second photosensitive film layer and the first resin layer by reactive ionic etching in a gaseous plasma.

4. A process according to claim 1, wherein, following irradiation, the second photosensitive film layer undergoes annealing.

5. A process according to claim 1, wherein the first resin layer is constituted by phenol formaldehyde resin.

6. A process according to claims 1 or 5, wherein the photosensitive film comprises for 100 parts by weight of poly-p-trimethylsilyloxystyrene, 5 to 15 parts by weight of triphenyl sulphonium hexafluoroarsenate and 3 to 10 parts by weight of perylene.

7. A process according to claim 6, wherein irradiation takes place at a wavelength of 386 to 475 nm.

* * * * *